United States Patent
Tang et al.

(10) Patent No.: US 10,715,790 B2
(45) Date of Patent: Jul. 14, 2020

(54) SYSTEM AND METHOD FOR LEAD FOOT ANGLE INSPECTION USING MULTIVIEW STEREO VISION

(71) Applicant: Generic Power Pte Ltd., Singapore (SG)

(72) Inventors: Hak Wee Tang, Singapore (SG); Ruini Cao, Singapore (SG); Kok Yeow Lim, Singapore (SG); Zin Oo Thant, Singapore (SG)

(73) Assignee: GENERIC POWER PTE LTD, Singapore (SG)

( * ) Notice: Subject to any disclaimer, the term of this patent is extended or adjusted under 35 U.S.C. 154(b) by 0 days.

(21) Appl. No.: 15/577,446

(22) PCT Filed: May 2, 2017

(86) PCT No.: PCT/SG2017/050232
§ 371 (c)(1),
(2) Date: Nov. 28, 2017

(87) PCT Pub. No.: WO2018/203824
PCT Pub. Date: Nov. 8, 2018

(65) Prior Publication Data
US 2018/0324409 A1 Nov. 8, 2018

(51) Int. Cl.
*H04N 13/282* (2018.01)
*H01L 21/67* (2006.01)
(Continued)

(52) U.S. Cl.
CPC ......... *H04N 13/282* (2018.05); *G06T 7/0006* (2013.01); *G06T 7/80* (2017.01);
(Continued)

(58) Field of Classification Search
None
See application file for complete search history.

(56) References Cited

U.S. PATENT DOCUMENTS 5,477,138 A * 12/1995 Erjavic ................ G01R 31/311
324/762.02
5,991,434 A * 11/1999 St. Onge ............... G06T 7/0006
382/146

(Continued)

OTHER PUBLICATIONS

Written Opinion of the International Searching Authority for corresponding application PCT/SG2017/050232 filed May 2, 2017; dated Jun. 16, 2017.

*Primary Examiner* — Mohammed Jebari
(74) *Attorney, Agent, or Firm* — Cantor Colburn LLP

(57) ABSTRACT

The present invention includes a system and method for three-dimensional imaging and analysis of electronic components. Specifically, it permits rapid and reliable inspection of the lead foot angle in integrated circuit packages. A first image capturing device, a second image capturing device and a third image capturing device are arranged in a "corner shape" or "L-shape." The first image capturing device forms the corner and obtains an image of the bottom of the component. The perspective viewing angle of the second image capturing device and the perspective viewing angle of the third image capturing device are orthogonal to each other to allow accurate three-dimensional reconstruction of the lead angles and detection of flaws or bends.

4 Claims, 15 Drawing Sheets

(51) Int. Cl.
  *G06T 7/00* (2017.01)
  *G06T 7/80* (2017.01)
  *H04N 13/246* (2018.01)
  *H04N 13/243* (2018.01)
  *H01L 23/495* (2006.01)
  *H04N 13/00* (2018.01)

(52) U.S. Cl.
  CPC ..... *H01L 21/67288* (2013.01); *H04N 13/243* (2018.05); *H04N 13/246* (2018.05); *G06T 2207/10012* (2013.01); *G06T 2207/30148* (2013.01); *G06T 2207/30244* (2013.01); *H01L 23/49555* (2013.01); *H04N 2013/0081* (2013.01)

(56) References Cited

U.S. PATENT DOCUMENTS

| | | | | |
|---|---|---|---|---|
| 6,064,756 A | * | 5/2000 | Beaty | G06T 7/0002 382/146 |
| 6,111,702 A | * | 8/2000 | Nalwa | G02B 5/04 348/E5.03 |
| 6,141,040 A | | 10/2000 | Toh | |
| 6,242,756 B1 | * | 6/2001 | Toh | G01N 21/95684 250/559.34 |
| 6,307,210 B1 | | 10/2001 | Suzuki | |
| 8,107,719 B2 | | 1/2012 | Davidson | |
| 8,885,040 B2 | | 11/2014 | Puah | |
| 9,594,028 B2 | | 3/2017 | Tang | |
| 9,626,752 B2 | * | 4/2017 | Frandsen, Jr. | G06T 7/0004 |
| 2004/0105580 A1 | * | 6/2004 | Hager | G06K 9/32 382/154 |
| 2007/0183646 A1 | * | 8/2007 | Beaty | G01N 21/95684 382/145 |
| 2008/0204732 A1 | * | 8/2008 | Vodanovic | G01B 11/0608 356/237.1 |
| 2009/0238442 A1 | * | 9/2009 | Upham | G01R 31/2896 382/145 |
| 2009/0278925 A1 | * | 11/2009 | Koval | G01B 11/245 348/92 |
| 2015/0192528 A1 | | 7/2015 | Tang | |
| 2018/0040118 A1 | * | 2/2018 | Seo | G06T 7/62 |

* cited by examiner

SYSTEM AND METHOD FOR LEAD FOOT ANGLE INSPECTION USING MULTIVIEW STEREO VISION

CROSS REFERENCE TO RELATED APPLICATION

This application is a U.S. National Phase application under 35 U.S.C. § 371 of International Application No. PCT/SG2017/050232 filed on 2 May 2017, the disclosure of which is incorporated herein by reference.

TECHNICAL FIELD

The present invention relates to a system and method for determining the lead foot angle in Integrated Circuit (IC) packages with leads that extend outward such as Quad Flat Package (QFP) and Thin Small Outline Package (TSOP).

BACKGROUND

Stereo vision is the extraction of three-dimensional information from two or more digital images. It is particularly important to many industrial applications. For example, stereoscopic images are used to analyze and evaluate components of semiconductor chips. Microelectronics are typically made and packaged in large volumes in high-precision manufacturing environments. It is important for each of completed object to be inspected. Because of the small size of the components and large volume of small pieces, the inspection must be automated. Three-dimensional vision is essential because the inspection involves examining specific critical three-dimensional features of each package.

In traditional stereo vision, two cameras are usually displaced horizontally from one another in a manner similar to human binocular vision. For example, U.S. Pat. No. 8,107,719 discloses a vision system for the three-dimensional metrology of a rapidly moving semiconductor or packaged electronic objects. The system includes three cameras mounted to a back plate. The cameras are disposed on the same plane and are symmetrically arranged so that one camera is disposed at an acute angle, another camera is disposed at an obtuse angle and the third camera is disposed orthogonally relative to the field of view. This arrangement allows for the determination of the three-dimensional imaging and analysis of an object.

U.S. Pat. No. 8,885,040 discloses a stereo vision inspection system for ball and like protrusions of electronic components. It describes a method of full calibration of the stereo vision system, by which both the interior and the exterior parameters of the stereo cameras are determined. A rectified stereo camera system is then established. Conjugate points are detected on the rectified images and are used for reconstruction of the three-dimensional location information. The information is further used for three-dimensional measurement.

U.S. Pat. No. 9,594,028 discloses an improved stereo vision inspection system for determining coplanarity of three-dimensional features in integrated circuit packages. The system includes two side view cameras with tiltable lens arranged according to the Scheimpflug principle. The system improves the accuracy of the measurement by producing well-focused images of uniform light intensity.

In the above-mentioned systems, the stereo cameras are all arranged on one plane. While suitable for some uses, these systems have limitations. For example, these systems are not capable of inspecting the lead foot angle of all the leads in a Quad Flat Package (QFP) or similar device. They cannot detect the lead foot angle or a bend in a lead that extends parallel (or nearly parallel) to the cameras plane. As a QFP device has leads extending out on all four sides of its substrate, inspection of the lead foot angle of all the leads requires viewing the device at multiple angles. The inspection of the lead foot angle of all the leads is essential as a bent lead can affect reliability of the circuit and lead to a defective product.

A need, therefore, exists for an improved system and method that overcomes these limitations. It is, therefore, a motivation of the present invention to provide a three-dimensional vision inspection system that allows complete inspection of the lead foot angles of all the leads in the QFP devices. The system should be capable of rapidly inspecting a high volume of objects with high accuracy, precision and reliability.

SUMMARY

We describe a system for analyzing the lead foot angle of an object, such as a Quad Flat Package (QFP) or a Thin Small Outline Package (TSOP). It includes (a) a support, (b) a light source, (c) a first image capturing device, (d) a second image capturing device and (e) a third image capturing device. The first image capturing device is mounted at a first bottom viewing angle that is perpendicular to a plane where the object is placed for capturing a first bottom view image. The second image capturing device is mounted at a second perspective viewing angle from the object for capturing a second perspective view image. A third image capturing device is mounted at a third perspective viewing angle from the object for capturing a third perspective view image. The second perspective viewing angle and the third perspective viewing angle are orthogonal to each other.

In an embodiment, the first, second and third image capturing devices are arranged to form an L-shape or corner-shape. The first image capturing device is on the corner, the second image capturing device is on the left (or right) and the third image capturing device on the front (or back). Each of the image capturing devices includes a lens and a sensor, and has an optical axis passing through the center of its lens and the center of its sensor. The optical axis of the first image capturing device and the optical axis of the second image capturing device form a first alignment plane. And the optical axis of the first image capturing device and the optical axis of the third image capturing device form a second alignment plane. The said first alignment plane and the said second alignment plane are orthogonal to each other. An object such as a QFP with leads on four sides is placed below the first image capturing device. The first image capturing device and the second image capturing device are used to determine the lead foot angles of the leads that extend along the normal direction of the first alignment plane. The first image capturing device and the third image capturing device are used to determine the lead foot angles of the other leads that extend along the normal direction of the second alignment plane.

In an alternative embodiment, a fourth and a fifth image capturing device are added to the system. The fourth image capturing device is added on the opposite side of the second image capturing device with respect to the first image capturing device. The fifth image capturing device is added on the opposite side of the third image capturing device with respect to the first image capturing device. The first, second, third, fourth and fifth image capturing devices therefore form a cross-shape centered on the first image capturing device, with the second image capturing device and the fourth image capturing device being on the opposite sides of each other, and the third image capturing device and the fifth image capturing device being on the opposite sides of each other. The optical axis of the fourth image capturing device is on the first alignment plane formed by the optical axis of the first image capturing device and the optical axis of the second image capturing device. The optical axis of the fifth image capturing device is on the second alignment plane formed by the optical axis of the first image capturing device and the optical axis of the third image capturing device. The fourth image capturing device is used together with the first and the second image capturing device to determine the lead foot angles of the leads that extend along the normal direction of the first alignment plane. The fifth image capturing device is used together with the first and the third image capturing device to determine the lead foot angles of the other leads that extend along the normal direction of the second alignment plane.

We also describe a method of analyzing the lead foot angle of the leads on an object with leads on its substrate, such as a Quad Flat Package (QFP), that includes the steps of (1) obtaining a first bottom view image with the said first image capturing device from a first bottom view of the object, (2) obtaining a second perspective view image with the said second image capturing device from a second perspective viewing angle of the object, (3) obtaining a third perspective view image with the said third image capturing device from a third perspective viewing angle of the object that is orthogonal to the second perspective viewing angle, (4) combining the first bottom view image and the second perspective view image to determine the lead foot angle of the leads that extend along the normal direction of the first alignment plane formed by the optical axis of the first image capturing device and the optical axis of the second image capturing device and (5) combining the first bottom view image and the third perspective view image to determine the lead foot angle of the leads that extend along the normal direction of the second alignment plane formed by the optical axis of the first image capturing device and the optical axis of the third image capturing device. These steps can be repeated with a fourth and a fifth image capturing device (arranged in a cross-shape) to improve the accuracy and robustness of the system.

Further, we describe a method of combining the first bottom view image, the second perspective view image and the third perspective view image to determine the lead foot angle of the leads on an object with leads on its substrate, such as a Quad Flat Package (QFP), that includes the steps of (1) for those leads of the object that extend along the normal direction of the first alignment plane formed by the optical axis of the first image capturing device and the optical axis of the second image capturing device, detecting the lead tip point and at least one additional point that is at a specified distance from the lead tip point on the lead foot in the first bottom view image and the second perspective view image, (2) for those leads of the object that extend along the normal direction of the second alignment plane formed by the optical axis of the first image capturing device and the optical axis of the third image capturing device, detecting the lead tip point and at least one additional point that is at a specified distance from the lead tip point on the lead foot in the first bottom view image and the third perspective view image, (3) reconstructing the three-dimensional coordinates of each lead tip point and each additional point on the lead foot, (4) constructing a reference plane using the three-dimensional coordinates of all the lead tip points, (5) constructing the lead foot line of each lead using the three-dimensional coordinates of the lead tip point and the additional point on the lead foot and (6) determining the lead foot angle as the acute angle between the lead foot line and the reference plane.

INTRODUCTION

A first aspect of the invention is a system and method of three-dimensional imaging that uses three cameras arranged in an "L-shape" or "corner shape."

A second aspect of the invention is a system and method for inspecting the leads in an Integrated Circuit (IC) package such as a Quad Flat Package (QFP) or a Thin Small Outline Package (TSOP) to determine the lead foot angle and whether the package meets particular manufacturing specifications.

A third aspect of the invention is a more accurate and efficient inspection system for determining the lead foot angle in IC packages such as a QFP or TSOP.

A fourth aspect of the invention is a system that uses three cameras arranged in an "L-shape" or "corner shape" to analyze an object such as a QFP or TSOP in three dimensions.

A fourth aspect of the invention is a system that uses five cameras arranged in a "cross shape" to analyze an object such as a QFP or TSOP in three dimensions.

A fifth aspect of the invention is a method of analyzing an electronic package such as a QFP or TSOP using the images obtained by three, four or five cameras arranged to take images of the package from different angles.

These and other aspects of the invention will become apparent from the following description, taken in connection with the accompanying drawings, wherein, by way of illustration and example, at least one embodiment of the present invention is disclosed.

DETAILED DESCRIPTION OF THE INVENTION

Definitions

Figure 1:
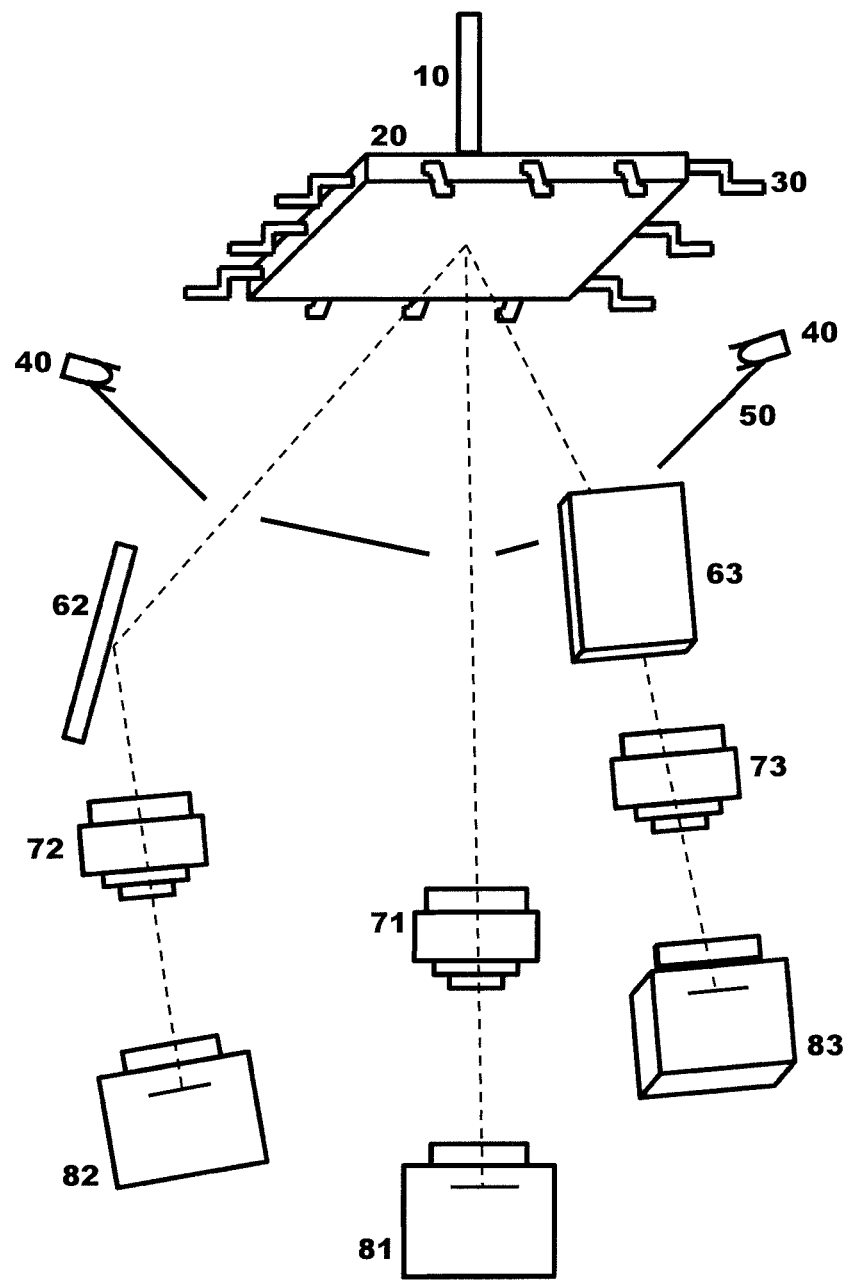
FIG. 1 is a perspective view of a preferred arrangement of the components of the system.

While the invention is primarily described for detecting defects in electronic components, it is understood that the invention is not so limited and can be used to assist with other endeavors that require rapid three-dimensional imaging and/or inspection of objects. For example, the system can be used to analyze the physical condition of any small object, such as its orientation, the dimensions of a particular feature on an object, the presence/absence of features on an object and/or the coplanarity of features on an object.

Reference in this specification to "one embodiment/aspect" or "an embodiment/aspect" means that a particular feature, structure, or characteristic described in connection with the embodiment/aspect is included in at least one embodiment/aspect of the disclosure. The use of the phrase "in one embodiment/aspect" or "in another embodiment/aspect" in various places in the specification are not necessarily all referring to the same embodiment/aspect, nor are separate or alternative embodiments/aspects mutually exclusive of other embodiments/aspects. Moreover, various features are described which may be exhibited by some embodiments/aspects and not by others. Similarly, various requirements are described which may be requirements for some embodiments/aspects but not other embodiments/aspects. Embodiment and aspect can be in certain instances be used interchangeably.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way.

Consequently, alternative language and synonyms may be used for any one or more of the terms discussed herein. Nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

The term "optical axis" refers to a line along which there is some degree of rotational symmetry in an optical system such as a camera lens or microscope. The optical axis is an imaginary line that defines the path along which light propagates through the system, up to first approximation.

The term "orthogonal" refers to intersecting or lying at right angles to one another.

The term "Quad Flat Package" or "QFP" refers to a surface mount integrated circuit package with "gull wing" leads extending from each of the four sides.

The term "seating plane" refers to a reference plane upon which to analyze individual leads for lead "foot" angle inspection.

The term "Thin Small Outline Package" or "TSOP" refers to a type of surface mount Integrated Circuit (IC) package. They typically have leads on two sides and are often used for RAM or Flash memory ICs due to their high pin count and small volume.

The term "integrated circuit" or "IC" refers to a small complex of electronic components and their connections that is produced in or on a small slice of material such as silicon.

It will be appreciated that terms such as "left," "right," "front," "back," "top," "bottom," "up," "down," and "below" used herein are merely for ease of description and refer to the orientation of the components as shown in the figures. It should be understood that any orientation of the components described herein is within the scope of the present invention.

Other technical terms used herein have their ordinary meaning in the art that they are used, as exemplified by a variety of technical dictionaries.

DESCRIPTION OF PREFERRED EMBODIMENTS

FIG. 1 represents an embodiment of the invention for lead foot angle inspection of a Quad Flat Package (QFP) component. The object to be inspected 20 is supported by a pickup head 10. The object has "gull wing" leads 30 on all four sides of its substrate. The leads extend slightly out, then down and out again.

Here, the object 20 is illuminated by a light source 40 and a diffusive reflector 50. The light emitted from the light source 40 is reflected by the diffusive reflector 50 to illuminate the object to be inspected 20.

The system includes at least three image capturing devices. The first image capturing device includes a lens 71 and a sensor 81 and is mounted perpendicular to the object to be inspected 20 to capture a first bottom view image of the object. The second image capturing device also includes a lens 72 and a sensor 82 but is mounted at a slanted angle to the object to capture a second (or left) perspective view image. Likewise, the third image capturing device includes a lens 73 and a sensor 83 and is mounted at another slanted angle to the object to capture a third (or front) perspective view image. The second image capturing device and the third image capturing device are arranged in such a way that the second (or left) perspective viewing angle is orthogonal to the third (or front) perspective viewing angle. Mirrors (62, 63) are included for the second and third image capturing devices.

The optical axis of the first image capturing device (i.e. the line passing through the center of the lens 71 and the center of the sensor 81) and the optical axis of the second image capturing device (i.e. the line passing through the center of the lens 72 and the center of the sensor 82) form a first alignment plane.

The optical axis of the first image capturing device (i.e. the line passing through the center of the lens 71 and the center of the sensor 81) and the optical axis of the third image capturing device (i.e. the line passing through the center of the lens 73 and the center of the sensor 83) form a second alignment plane. The first alignment plane and the second alignment plane are orthogonal to each other. This is further illustrated in FIG. 2.

Figure 2:
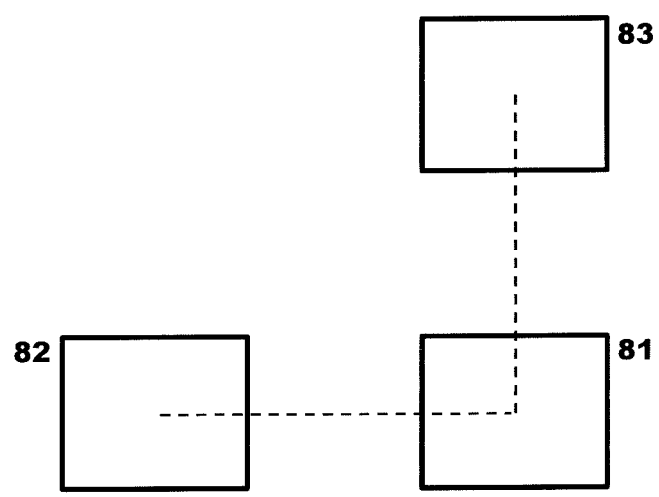
FIG. 2 is a bottom view of the system in FIG. 1 that depicts the arrangement of the image capturing devices.

FIG. 2 depicts a bottom view of the arrangement of the three image capturing devices. The three image capturing devices form a "corner shape," "L-shape," or "backwards L-shape" whereby the first image capturing device 81 is in the center, the second image capturing device 82 is on the left side of the first image capturing device 81, and the third image capturing device 83 is on the front side of the first image capturing device 81.

The three image capturing devices are calibrated with multi-view stereo vision principles so that the internal parameters of the respective image capturing devices and the exterior parameters or the relative poses of the three image capturing devices can be determined. These parameters are later used to reconstruct the three-dimensional coordinates of the points of interest on the object to be inspected.

Figure 3A:
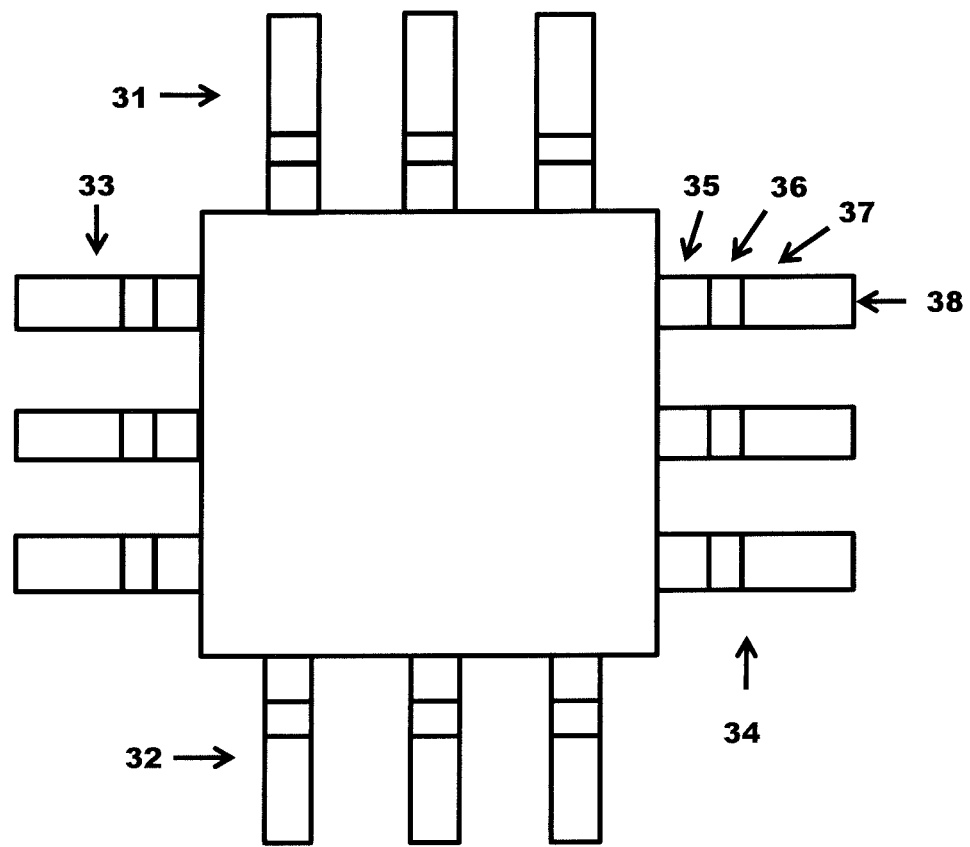
FIG. 3A is a bottom view of an Integrated Circuit (IC) package with leads on four sides.
Figure 3B:
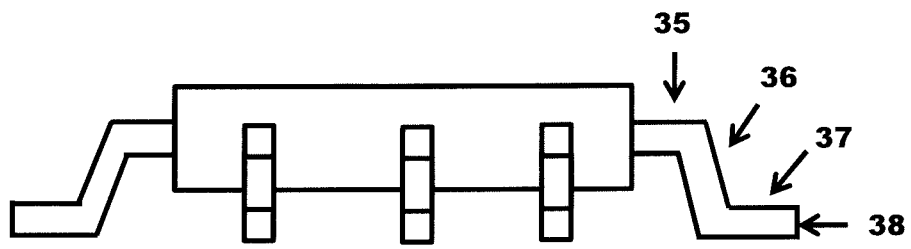
FIG. 3B is a lateral view of an IC package with leads on four sides.

FIGS. 3A and 3B depict an object, such as a QFP, to be inspected 20. FIG. 3A depicts the bottom view of the object and FIG. 3B depicts a lateral view. The object has four rows of leads, with each row of leads on one side of the object. The four rows are designated top row of leads 31, bottom row of leads 32, left row of leads 33, and right row of leads 34. Each lead has a lead shoulder 35, a lead leg 36 and a lead foot 37. The end of lead foot is lead tip 38. Lead foot angle is the angle of the lead foot 37 with respect to a reference plane. The reference plane can be a seating plane formed by the lead tips of the few lowest leads or a least mean square plane fitted through the lead tips of all the leads.

The system can also be used to inspect objects with alternative designs such as Thin Small Outline Packages (TSOP). For example, a chip or an electronic component can have two rows of leads only, such as top row of leads and bottom row of leads, or left row of leads and right row of leads (not shown).

Figure 4A:
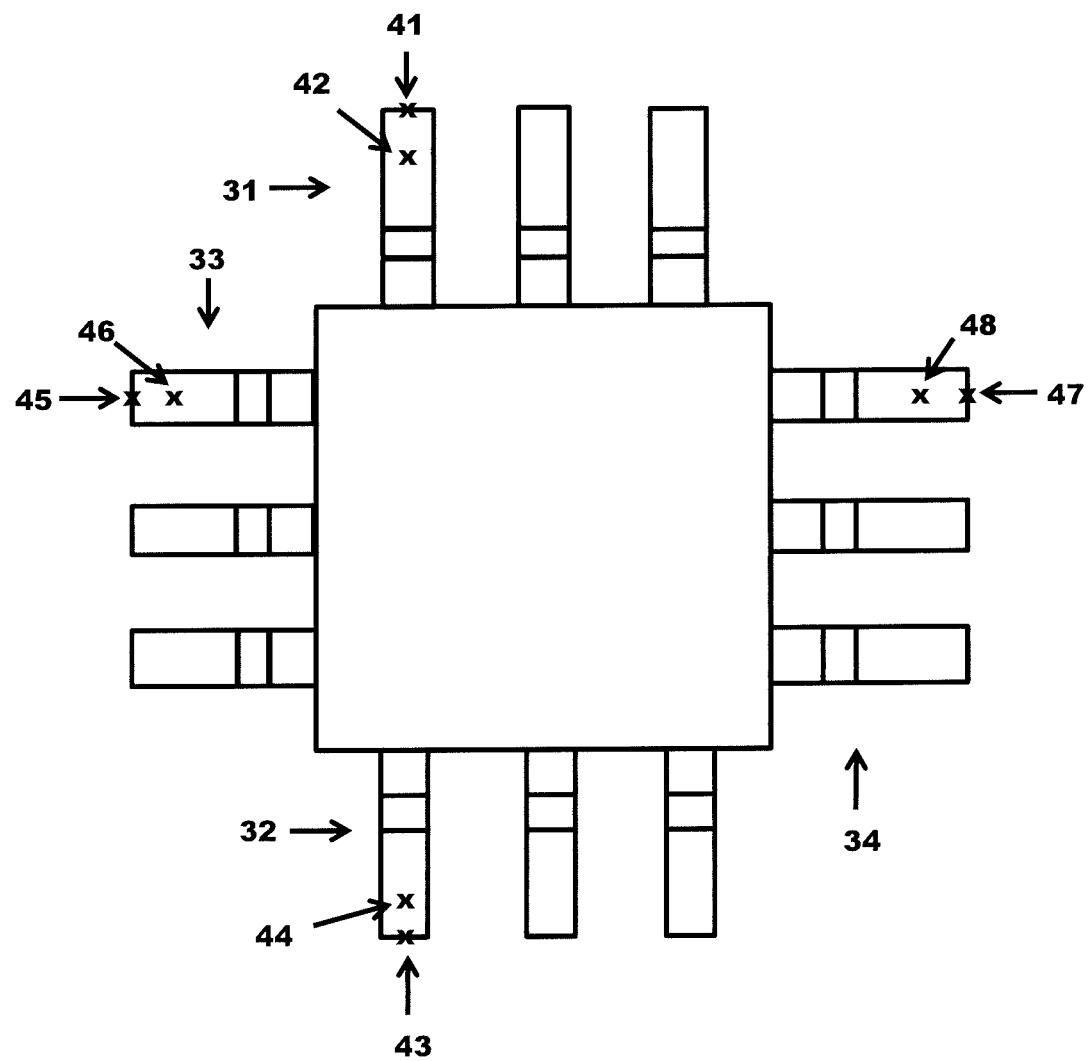
FIG. 4A depicts a bottom view image of an IC package taken from the first image capturing device with points of interest on the leads.
Figure 4B:
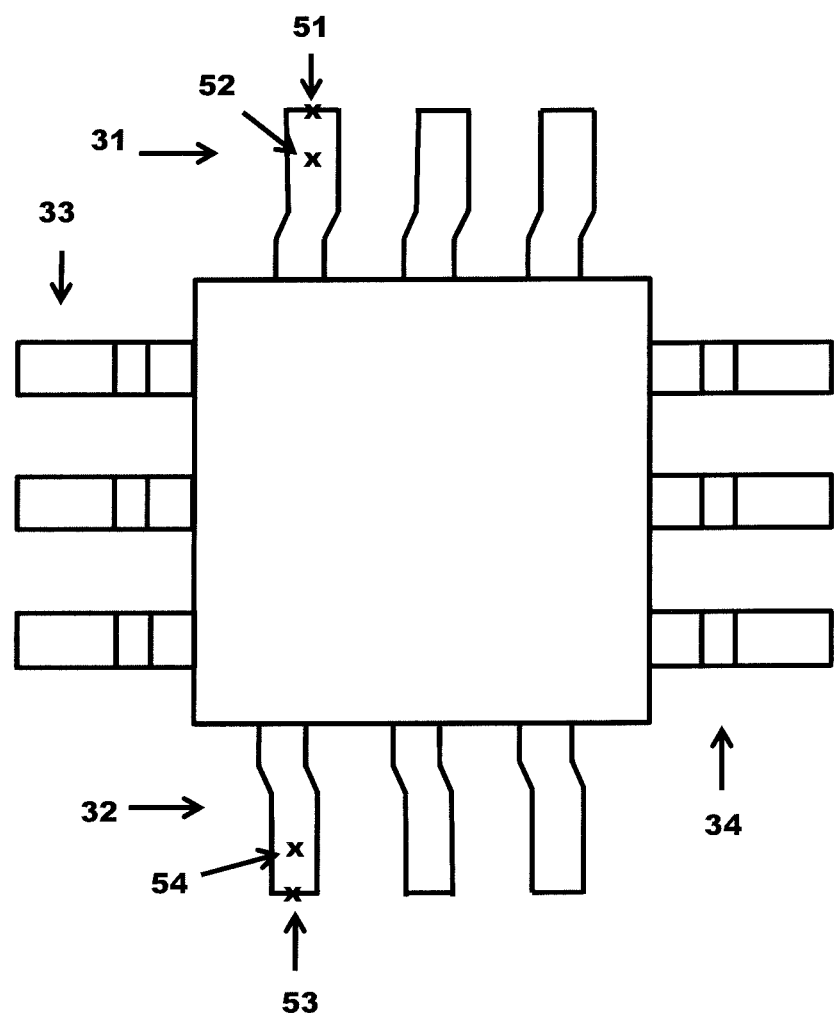
FIG. 4B depicts a left perspective view image of the IC package taken from the second image capturing device with the points of interest on the leads.

To establish the reference plane, the leads tips of all the leads are detected. For example, refer to the top row of leads 31. For each lead in the top row 31, the lead tip point 41 is detected in the bottom view image as shown in FIG. 4A. For the same lead, the lead tip point 51 is detected in the left perspective view image as shown in FIG. 4B. The detected lead tip point 41 and the detected lead tip point 51 can be referred to as "conjugate points" which correspond to the same physical lead tip yet in images taken from different cameras. From the detected conjugate points and the calibration results, the three-dimensional coordinates of the physical lead tip of the corresponding lead in the top row 31 can be determined.

Similarly, for each lead in the bottom row 32, the lead tip point 43 is detected in the bottom view image and the lead tip point 53 is detected in the left perspective view image. From the detected conjugate points 43 and 53, and the calibration results, the three-dimensional coordinates of the physical lead tip of the corresponding lead in the bottom row 32 can be determined.

Figure 4C:
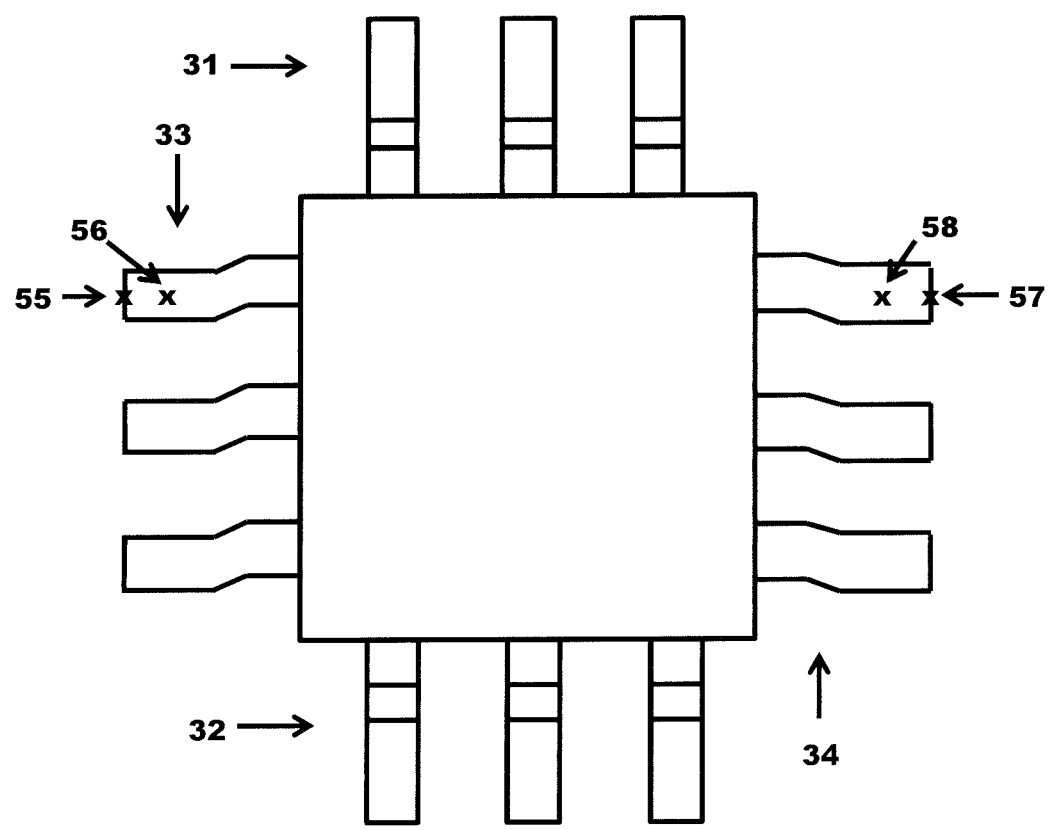
FIG. 4C depicts a front perspective view image of an IC package taken from the third image capturing device with the points of interest on the leads.

For each lead in the left row 33, the lead tip point 45 is detected in the bottom view image as shown in FIG. 4A. For the same lead, the lead tip point 55 is detected in the front perspective view image as shown in FIG. 4C. The detected lead tip point 45 and the detected lead tip point 55 are conjugate points. From the conjugate points and the calibration results, the three-dimensional coordinates of the lead tip of the corresponding lead in the left row 33 can be determined.

Similarly, for each lead in the right row 34, the lead tip point 47 is detected in the bottom view image and the lead tip point 57 is detected in the front perspective view image. From the detected conjugate points 47 and 57, and the calibration results, the three-dimensional coordinates of the lead tip of the corresponding lead in the right row 34 can be determined.

With the three-dimensional coordinates of the lead tips of all the leads in the rows (31, 32, 33, 34) a reference plane can be established in the three-dimensional space. The reference plane can be a seating plane formed by the lead tips of the few lowest leads or a least mean square plane fitted through the lead tips of all the leads. The reference plane will be the base plane for determining the lead foot angle of each lead.

To determine the lead foot angle of each lead, it is necessary to detect at least one more point on the lead foot. Take the top row of leads 31 again as an example. For each lead in the top row 31, another point 42 on the lead foot, which is at a preset distance away from the lead tip point 41, is detected in the bottom view image as shown in FIG. 4A. For the same lead, a point 52 on the lead foot, which is at the same distance away from the lead tip point 51, is detected in the left perspective view image as shown in FIG. 4B. The detected point 42 and the detected point 52 are conjugate points as well. From the conjugate points and the calibration results, the three-dimensional coordinates of the corresponding point on the lead foot of the corresponding lead in the top row 31 can be determined.

Similarly, for each lead in the bottom row 32, a point 44 on the lead foot, which is at a preset distance away from the lead tip point 43, is detected in the bottom view image, and a point 54 on the lead foot, which is at the same distance away from the lead tip point 53, is detected in the left perspective view image. From the detected conjugate points 44 and 54, and the calibration results, the three-dimensional coordinates of the corresponding point on the lead foot of the corresponding lead in the bottom row 32 can be determined.

For each lead in the left row 33, a point 46 on the lead foot, which is at a preset distance away from the lead tip point 45, is detected in the bottom view image as shown in FIG. 4A. For the same lead, a point 56 on the lead foot, which is at the same distance away from the lead tip point 55, is detected in the front perspective view image as shown in FIG. 4C. From the detected conjugate points 46 and 56, and the calibration results, the three-dimensional coordinates of the corresponding point on the lead foot of the corresponding lead in the left row 33 can be determined.

Similarly, for each lead in the right row 34, a point 48 on the lead foot, which is at a preset distance away from the lead tip point 47, is detected in the bottom view image, and a point 58 on the lead foot, which is the same distance away from the lead tip point 57, is detected in the front perspective view image. From the detected conjugate points 48 and 58, and the calibration results, the three-dimensional coordinates of the corresponding point on the lead foot of the corresponding lead in the right row 34 can be determined.

Figure 5A:
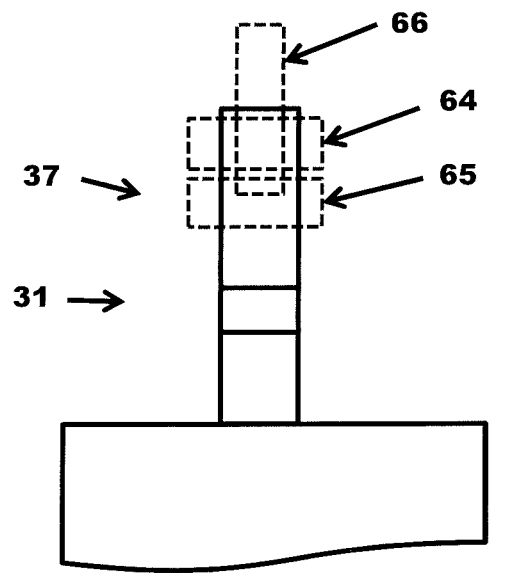
FIG. 5A depicts a method for detecting the points of interest on the bottom view image of an IC package captured by the first image capturing device.
Figure 5A:
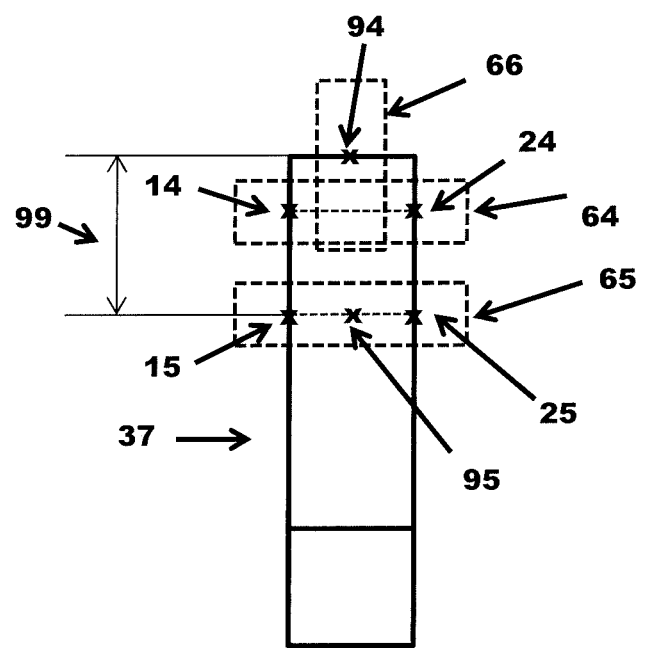
Figure 5B:
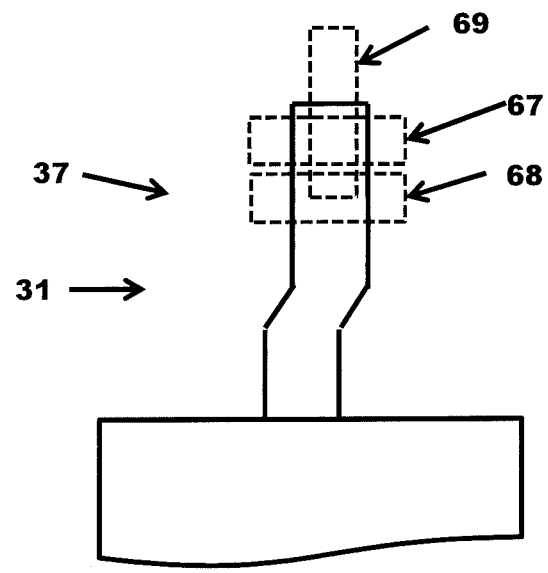
FIG. 5B depicts a method for detecting the points of interest on the left perspective view image of an IC package captured by the second image capturing device.
Figure 5B:
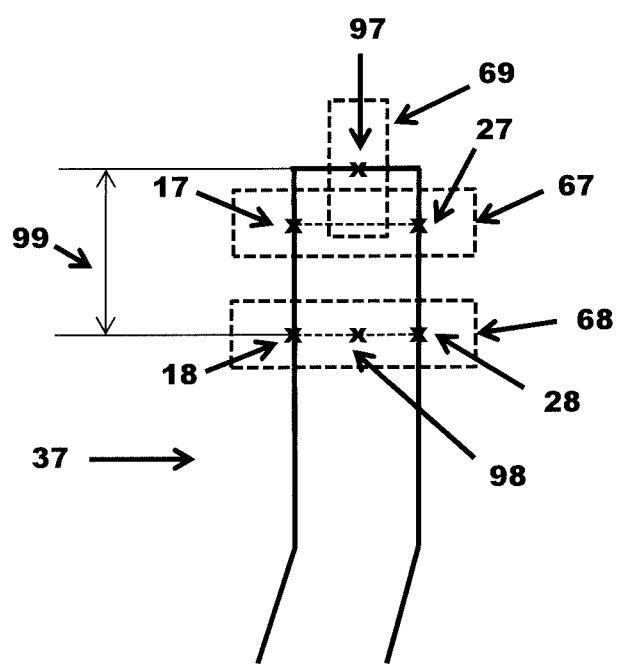

FIGS. 5A and 5B illustrate the detailed method of detecting the lead tip point and the additional point on the lead foot for one lead in the top row 31. FIG. 5A depicts the bottom view image and FIG. 5B depicts the left perspective view image.

As shown in FIG. 5A, a horizontal edge detection window 64 is put near the lead tip. Two edge points 14 and 24 are detected as the sharpest transitions in the vertical projection profile. Let the x coordinate of the edge point 14 be $x_1$ and the x coordinate of the edge point 24 be $x_2$. Let the middle of $x_1$ and $x_2$ be $x_0$. A vertical edge detection window 66 is put on the lead tip. One edge point 94 is detected as the sharpest transition in the horizontal projection profile. Let the y coordinate of the edge point 94 be $y_0$. Then, the x, y coordinates of the detected lead tip point on the lead will be $(x_0, y_0)$. Another horizontal edge detection window 65 is put at a preset distance 99 away from the lead tip point 94. Two edge points 15 and 25 are detected as the sharpest transitions in the vertically projection profile. The middle point 95 between the point 15 and the point 25 will be the detected additional point on the lead foot.

Similarly, the lead tip point 97 and the middle point 98 on the lead foot of the same lead are detected in the left perspective view image as shown in FIG. 5B. A horizontal edge detection window 67 is put near the lead tip. Two edge points 17 and 27 are detected as the sharpest transitions in the vertical projection profile. A vertical edge detection window 69 is put on the lead tip. The edge point 97 is detected as the sharpest transition in the horizontal projection profile. The middle of the x coordinates of the edge points 17 and 27 will be the x coordinate of the detected lead tip point on the lead. The y coordinate of the edge point 97 will be the y coordinate of the detected lead tip point on the lead. Another horizontal edge detection window 68 is put at the same preset distance 99 away from the lead tip point 97. Two edge points 18 and 68 are detected as the sharpest transitions in the vertically projection profile. The middle point 98 between the points 18 and 28 will be the detected additional point on the lead foot.

The lead tip point 94 on the bottom view image in FIG. 5A and the lead tip point 97 on the left perspective view image in FIG. 5B are conjugate points. They correspond to the lead tip of the same physical lead. From the conjugate points 94 and 97, and the calibration results, the three-dimensional coordinates of the physical lead tip 91 as shown in FIG. 5C can be reconstructed.

The point 95 on the lead foot on the bottom view image in FIG. 5A and the point 98 on the lead foot on the left perspective view image are conjugate points. They correspond to the same physical point on the lead foot of the same lead. From the conjugate points 95 and 98, and the calibration results, the three-dimensional coordinates of the physical point 92 on the lead foot as shown in FIG. 5C can be reconstructed.

Figure 5C:
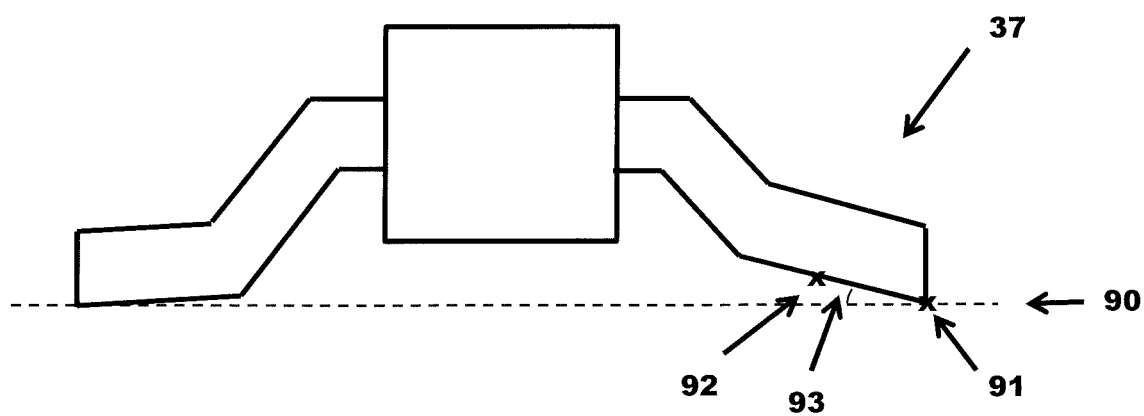
FIG. 5C depicts a method for determining the lead foot angle in an IC package such as a QFP.

As shown in FIG. 5C, the physical point 92 on the lead foot and the physical lead tip 91 form a three-dimensional line in the three dimensional space. This is the lead foot line of the lead. The acute angle between the three-dimensional lead foot line and the three-dimensional reference plane 90 will be the lead foot angle 93 of the lead.

Figure 5D:
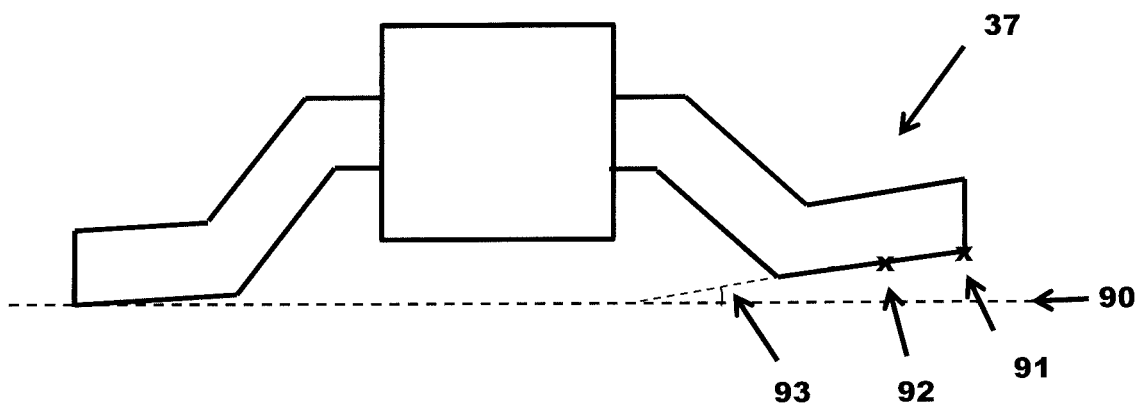
FIG. 5D depicts the negative lead foot angle in an IC package such as a QFP.

The lead foot angle of a lead can be positive or negative. With a positive lead foot angle, the lead foot is directed toward the reference plane 90 as shown in FIG. 5C. With a negative lead foot angle, the lead foot is directed away from the reference plane 90 as shown in FIG. 5D.

Figure 6A:
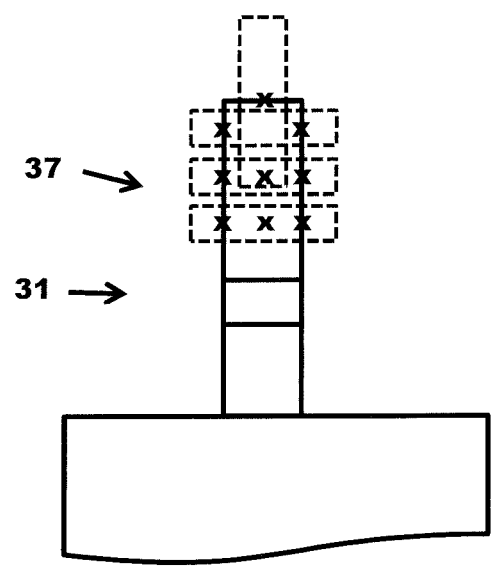
FIG. 6A depicts a method for detecting multiple additional points of interest on the bottom view image of an IC package captured by the first image capturing device.
Figure 6B:
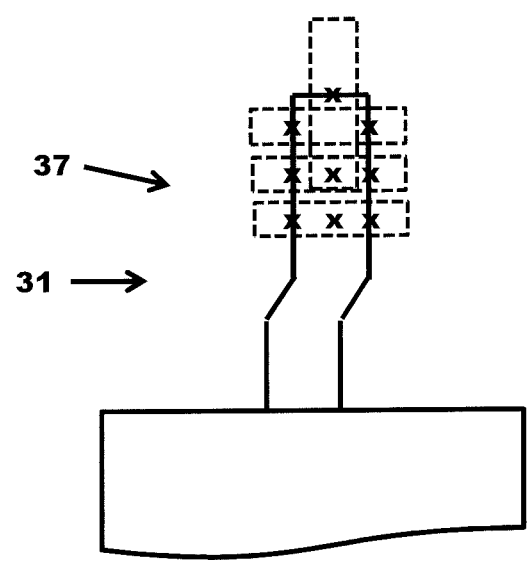
FIG. 6B depicts a method for detecting multiple additional points of interest on the left perspective view image of an IC package captured by the second image capturing device.
Figure 6C:
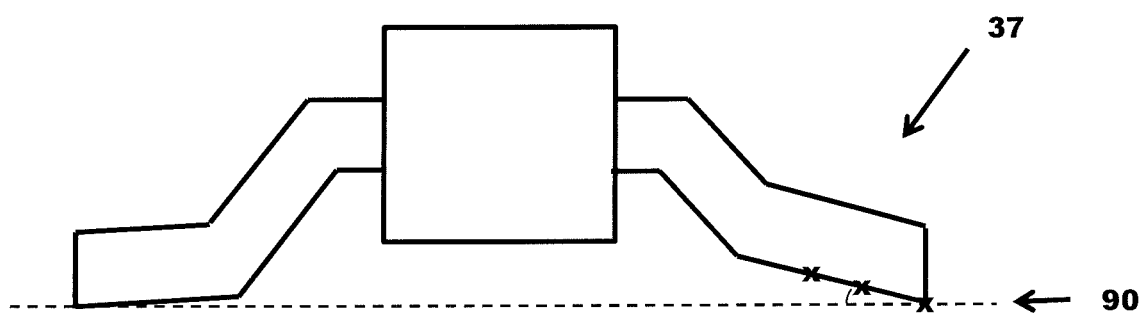
FIG. 6C depicts a method for determining the lead foot angle with multiple additional points in an IC package such as a QFP.

Multiple additional points on the lead foot can be detected to improve the accuracy and the robustness of the method as shown in FIG. 6A, FIG. 6B and FIG. 6C. In this case, a three-dimensional lead foot line is fit through the three-dimensional coordinates of all the detected points. The lead foot angle is the acute angle between the three-dimensional lead foot line and the three-dimensional reference plane.

As described above, for the top row of leads 31 and the bottom row of leads 32, whereby the direction of the leads are along the normal direction of the alignment plane formed by the bottom viewing angle and the left perspective viewing angle, the additional points on the lead foot are detected in the bottom view image and the left perspective view image respectively. Whereas, for the left row of leads 33 and the right row of leads 34, whereby the direction of the leads are along the normal direction of the alignment plane formed by the bottom viewing angle and the front perspective viewing angle, the additional points on the lead foot are detected in the bottom view image and the front perspective view image.

The reasoning behind this method is as follows. The additional point on the lead foot is defined as a point at a preset distance away from the lead tip. As shown in FIG. 4B, for the top row of leads 31 and the bottom row of leads 32, the point on the lead foot are defined at a certain distance away from the lead tip along the y axis or in the vertical direction. As the distance is a preset fixed value, it does not contain any three-dimensional information. So the three-dimensional information for the point on the lead foot can only be extracted along the x axis or in the horizontal direction. The left perspective view image contains this information.

Take the top row of leads 31 as an example. As shown in FIG. 5B, the point 98 is the additional point defined on the lead foot. The distance from the point 98 to the lead tip point 97 is preset, which is the offset of the y coordinate of the point 98 with respect to the point 97. So, the y coordinate of the point 98 has no three-dimensional information. The offset of the x coordinate does contain the three-dimensional information on the left perspective view image.

Similarly, as shown in FIG. 4C, for the left row of leads 33 and the right row of leads 34, the point on the lead foot is defined as a point at a certain distance away from the lead tip point along the x axis or in the horizontal direction. So the x coordinate does not contain the three-dimensional information of the point. The three-dimensional information of the point must be extracted along the y axis or in the vertical direction. The front perspective view image contains this information exactly.

This also helps explain the L-shape arrangement of the three image capturing devices in the system. The combination of the bottom view image capturing device and the left perspective view image capturing device is used for lead foot angle inspection for the top row of leads and the bottom row of leads. The combination of the bottom view image capturing device and the front perspective view image capturing device is used for lead foot angle inspection for the left row of leads and the right row of leads.

Figure 7:
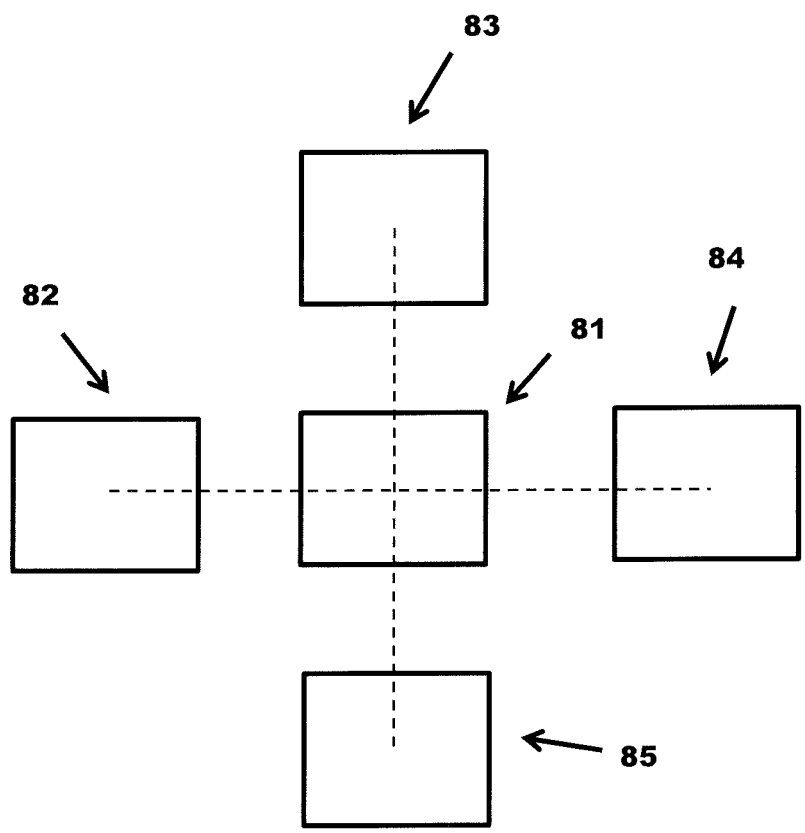
FIG. 7 depicts a bottom view of an alternative embodiment of the invention that includes two additional image capturing devices.
Figure 8:
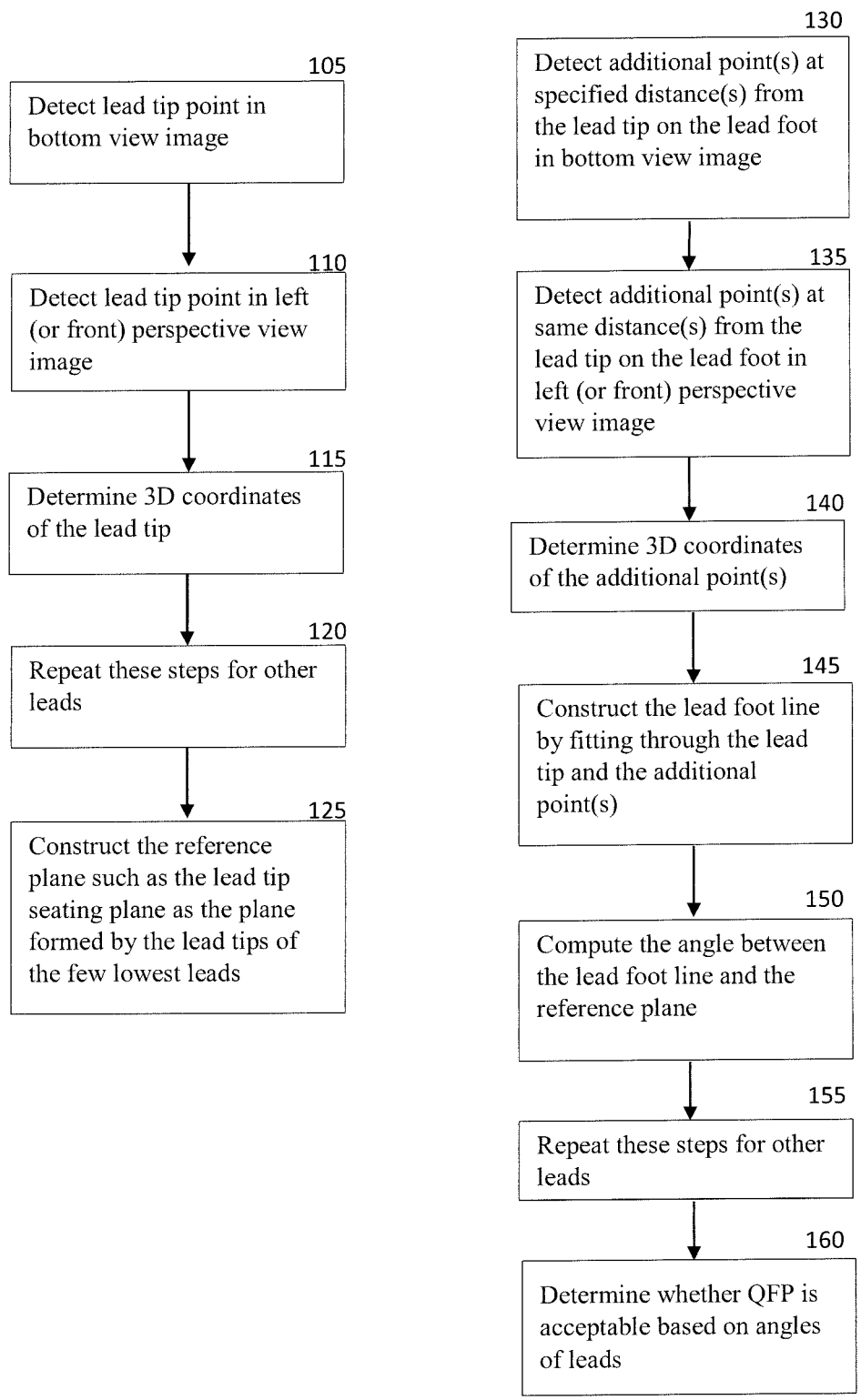
FIG. 8 is a flow chart depicting the steps in analyzing the lead foot angle in an IC package such as a QFP.

Additional image capturing devices can be added to improve the accuracy and the robustness of the apparatus. As shown in FIG. 7, a fourth image capturing device 84 can be added and be mounted in a position symmetric to the second image capturing device 82 with respect to the first image capturing device 81. And a fifth image capturing device 85 can be added and be mounted in a position symmetric to the third image capturing device 83 with respect to the first image capturing device 81. As a whole, the five image capturing devices form a cross-shape. The fourth image capturing device 84 captures a right perspective view image of the object to be inspected. The fifth image capturing device 85 captures a back perspective view image of the object to be inspected.

In the cross-shape configuration, the combination of the bottom view image, the left perspective view image and the right perspective view image is used to inspect the lead foot angle of the top row of leads and the bottom row of leads, and the combination of the bottom view image, the front perspective view image and the back perspective view image is used to inspect the lead foot angle of the left row of leads and the right row of leads.

Each of the fourth and the fifth image capturing device has a lens and a sensor as well. The optical axis of the fourth image capturing device (i.e. the line passing through the center of the lens and the center of the sensor), the optical axis of the first image capturing device and the optical axis of the second image capturing device form a first alignment plane.

The optical axis of the fifth image capturing device (the line passing through the center of the lens and the center of the sensor), the optical axis of the first image capturing device and the optical axis of the third image capturing device form a second alignment plane. The first alignment plane and the second alignment plane are orthogonal to each other.

The cross-shape configuration can be more accurate and more robust than the L-shape configuration.

The steps of analyzing the lead foot angle are depicted in FIG. 9. First, the lead tip is detected in the bottom view image and the left (or front) perspective view image as depicted at step 105 and 110. The three-dimensional coordinates of the lead tip are reconstructed using stereo vision techniques as depicted at step 115. Repeat the steps 105, 110 and 115 for all the other leads. Using the three-dimensional coordinates of the lead tips, a reference plane can be established in the three-dimensional space 125.

Next, one or multiple additional points on the lead foot area are detected in the bottom view image and the left (or front) perspective view image as depicted at step 130 and 135. The three-dimensional coordinates of the additional points are reconstructed using stereo vision techniques as depicted at step 140. By connecting the lead tip and the additional points, the lead foot line can be constructed as depicted at step 145. The acute angle between the lead foot line and the reference plane will be the lead foot angle as depicted at step 150. Repeat the steps (130, 135, 140, 145, and 150) for all the other leads 155.

Finally, the object such as the QFP is determined to be accepted or rejected based on lead foot angles as at step 160. A lead bent beyond a specific angle (positive or negative) can indicate a defective or damaged QFP. When the lead foot angles of all the leads are within the desired tolerance, the QFP is acceptable.

What is claimed is:

1. A system for analyzing the lead foot angle of leads extending outwards from an integrated circuit package, the leads disposed in rows of leads with each row of leads extending from a respective one side of the object, each of the leads including a lead shoulder, a lead leg, and a lead foot, wherein an end of each lead foot is a lead tip, wherein the rows of leads define a top row of leads, a bottom row of leads, a left row of leads and a right row of leads, the system comprising:

a) a support for said integrated circuit package;
   b) a light source;
   c) a first image capturing device comprising a first lens and a first sensor and being mounted at a first bottom viewing angle that is perpendicular to a plane where said integrated circuit package is placed for capturing a first bottom view image,
   d) a second image capturing device comprising a second lens and a second sensor and being mounted at a second perspective viewing angle from said integrated circuit package for capturing a second perspective view image,
   e) a third image capturing device comprising a third lens and a third sensor and being mounted at a third perspective viewing angle from said integrated circuit package for capturing a third perspective view image,
   wherein the first, second and third image capturing devices form a corner shape that defines an L-shape with the first image capturing device in the center, the second image capturing device on a left side of the first image capturing device and the third image capturing device on a front side of the first image capturing device;
   wherein a first optical axis of the first imaging capturing device is a line passing through the center of said first lens and the center of said first sensor, a second optical axis of the second image capturing device is a line passing through the center of said second lens and the center of said second sensor and a third optical axis of the third image capturing device is a line passing through the center of said third lens and the center of said third sensor;
   wherein the first optical axis and the second optical axis form a first alignment plane with a normal direction and the first optical axis and third optical axis form a second alignment plane with a normal direction;
   wherein said first alignment plane and said second alignment plane are orthogonal to each other;
   wherein the normal direction of said first alignment plane is along the lead extending orientation of the leads extending outwards from the front side and the back side of said integrated circuit package;
   wherein the normal direction of said second alignment plane is along the lead extending orientation of the leads extending outwards from the left side and the right side of said integrated circuit package; and
   wherein the first, second and third image capturing devices are calibrated with multi-view stereo vision principles;
   wherein, for one or more leads on each of the rows of leads, the system is configured to detect conjugate lead tip points, wherein the conjugate lead tip points are detected by the first image capturing device and either the second image capturing device or the third image capturing device, and three dimensional coordinates are established for each lead tip of the one or more leads from the detected conjugate lead tip points and the calibration;
   wherein, the system is configured to establish a three-dimensional reference plane from the three dimensional coordinates of each lead tip of the one or more leads;

wherein, for a first lead of the one or more leads, the system is configured to:

detect lead foot middle points, wherein the lead foot middle points are detected by the same image capturing devices that detect the conjugate lead tip points for the first lead, and three dimensional coordinates are established for the lead foot middle points of the first lead from the detected middle points and the calibration;

determine a first lead foot line for the first lead, between the three dimensional coordinates of the lead tip of the first lead and the three dimensional coordinates of the lead foot middle points for the first lead; and determine a first lead foot angle for the first lead, between the first lead foot line and the reference plane.

2. The system of claim 1, wherein a fourth image capturing device comprising a fourth lens and a fourth sensor is mounted at a fourth perspective viewing angle from said integrated circuit package for capturing a fourth perspective view image, and a fifth image capturing device comprising a fifth lens and a fifth sensor is mounted at a fifth perspective viewing angle from said integrated circuit package for capturing a fifth perspective view image;

wherein the first image capturing device, the second image capturing device, the third image capturing device, the fourth image capturing device and the fifth image capturing device, form a cross-shape centered on the first image capturing device;

wherein the second image capturing device and the fourth image capturing device are on opposing sides of the first image capturing device;

wherein the third image capturing device and the fifth image capturing device are on opposing sides of the first image capturing device; and wherein a fourth optical axis of the fourth image capturing device is a line passing through the center of said fourth lens and the center of said fourth sensor and a fifth optical axis of the fifth imaging capturing device is a line passing through the center of said fifth lens and the center of said fifth sensor;

wherein said fourth optical axis of the fourth image capturing device is on said first alignment plane and said fifth optical axis of the fifth imaging device is on said second alignment plane;

wherein said first alignment plane and said second alignment plane are orthogonal to each other, and wherein the first, second, third, fourth and fifth image capturing devices are calibrated with multi-view stereo vision principles.

3. A method of determining the lead foot angle of leads on an integrated circuit package, comprising the steps of:

a) Presenting an integrated circuit package using a support;

b) Illuminating the integrated circuit package with a light source;

c) Obtaining a first bottom view image of the integrated circuit package with a first image capturing device;

d) Obtaining a second perspective view image of the integrated circuit package with a second image capturing device;

e) Obtaining a third perspective view image of the integrated circuit package with a third image capturing device;

f) for those leads that extend along the normal direction of a first alignment plane formed by a first optical axis of the first image capturing device and a second optical axis of the second image capturing device, detecting a lead tip point and one or multiple additional points at preset distances from a lead tip on the lead foot in the first bottom view image and the second perspective view image;

g) for those leads that extend along the normal direction of a second alignment plane formed by the first optical axis and a third optical axis of the third image capturing device, detecting a lead tip point and one or multiple additional points at preset distances from a lead tip on the lead foot in the first bottom view image and the third perspective view image;

h) reconstructing three-dimensional coordinates of each lead tip point;

i) constructing a reference plane with the lead tip points;

j) reconstructing the three-dimensional coordinates of each additional point on each lead foot;

k) constructing a lead foot line by fitting through the lead tip and the one or multiple additional points on each lead foot; and l) determining the lead foot angle as the acute angle between the lead foot line and the reference plane for each lead foot.

4. A method of determining the lead foot angle of the leads on an integrated circuit package, comprising the steps of:

a) Presenting an integrated circuit package using a support;

b) Illuminating the integrated circuit package with a light source;

c) Obtaining a first bottom view image of the integrated circuit package with a first image capturing device;

d) Obtaining a second perspective view image of the integrated circuit package with a second image capturing device;

e) Obtaining a third perspective view image of the integrated circuit package with a third image capturing device;

f) Obtaining a fourth perspective view image of the integrated circuit package with a fourth image capturing device;

g) Obtaining a fifth perspective view image of the integrated circuit package with a fifth image capturing device;

h) for those leads that extend along the normal direction of a first alignment plane formed by a first optical axis of the first image capturing device, a second optical axis of the second image capturing device and a fourth optical axis of the fourth image capturing device, detecting a lead tip point and one or multiple additional points at preset distances from a lead tip on the lead foot in the first bottom view image, the second perspective view image and the fourth perspective view image;

i) for those leads that extend along the normal direction of a second alignment plane formed by said first optical axis, a third optical axis of the third image capturing device and a fifth optical axis of the fifth image capturing device, detecting a lead tip point and one or multiple additional points at preset distances from a lead tip on a lead foot in the first bottom view image, the third perspective view image and the fifth perspective view image;

j) reconstructing three-dimensional coordinates of each lead tip point;

k) constructing a reference plane with all the lead tip points;

l) reconstructing the three-dimensional coordinates of each additional point on each lead foot;

m) constructing a lead foot line by fitting through the lead tip and the one or multiple additional points on each lead foot; and n) determining the lead foot angle as the acute angle between the lead foot line and the reference plane for each lead foot.

\* \* \* \* \*